(12) United States Patent
Guyot (10) Patent No.: US 7,034,720 B2
(45) Date of Patent: Apr. 25, 2006

(54) DIGITAL-TO-ANALOG CONVERTER COMPRISING MEANS FOR IMPROVING THE CONVERSION LINEARITY

(75) Inventor: Benoit Guyot, Anisy (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/522,462

(22) PCT Filed: Jul. 23, 2003

(86) PCT No.: PCT/IB03/03302

§ 371 (c)(1),
(2), (4) Date: Jan. 26, 2005

(87) PCT Pub. No.: WO2004/013970

PCT Pub. Date: Feb. 12, 2004

(65) Prior Publication Data

US 2006/0033651 A1    Feb. 16, 2006

(30) Foreign Application Priority Data

Jul. 31, 2002    (FR)    ................................... 02 09748

(51) Int. Cl.
*H03M 1/06*    (2006.01)
(52) U.S. Cl. .................. 341/118; 341/144; 341/145
(58) Field of Classification Search ................ 341/118, 341/120, 136, 126, 138
See application file for complete search history.

(56) References Cited

U.S. PATENT DOCUMENTS

| 5,870,049 A | * | 2/1999 | Huang et al. ............... 341/144 |
| 6,329,940 B1 | * | 12/2001 | Dedic .......................... 341/144 |
| 6,639,534 B1 | * | 10/2003 | Khoini-Poorfard et al. . 341/144 |

* cited by examiner

*Primary Examiner*—John B Nguyen
(74) *Attorney, Agent, or Firm*—Aaron Waxler

(57) ABSTRACT

The invention relates to a digital-to-analog converter for converting a digital value into an analog quantity, said converter comprising current sources switched as a function of said digital value in order to generate an output current reflecting the value of said analog quantity. The converter comprises means of generating a correction current added to said output current, said correction current comprising a component proportional to the square of said output current. Use: Digital-to-analog converter.

5 Claims, 7 Drawing Sheets

DIGITAL-TO-ANALOG CONVERTER COMPRISING MEANS FOR IMPROVING THE CONVERSION LINEARITY

FIELD OF THE INVENTION

The invention relates to a digital-to-analog converter for converting a digital value into an analog quantity, said converter comprising current sources switched according to said digital value in order to generate an output current reflecting the value of said analog quantity.

The invention has in particular many applications in digital-to-analog converters having an architecture of the thermometric or segmented type.

BACKGROUND OF THE INVENTION

Some digital-to-analog converter architectures are based on the switching of a certain number of current sources in an output load. For example, the number of current sources switched simultaneously in a converter having an architecture of the thermometric or segmented type is equal to the digital input value to be converted.

Figure 1:
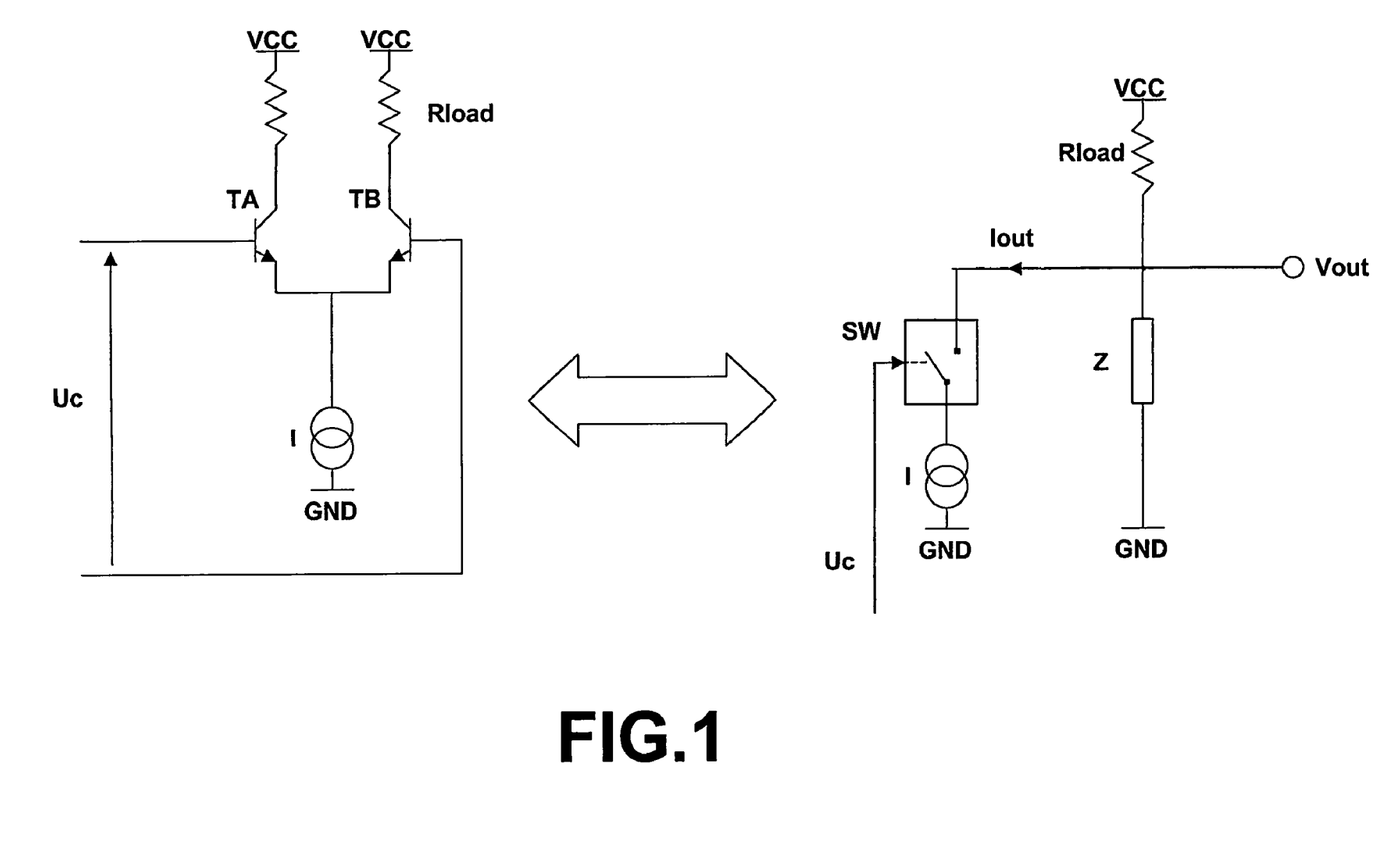
FIG. 1 describes a switch for a current source used in a digital-to-analog converter.

FIG. 1 depicts a switch of a known type used in a digital-to-analog converter for making a current source I flow into an output load R. This switch consists of a differential structure comprising bipolar transistors TA and TB controlled by a control signal Uc derived from the digital value to be converted. The function of this switch is therefore equivalent to a switch SW controlled by the control signal Uc.

Figure 2:
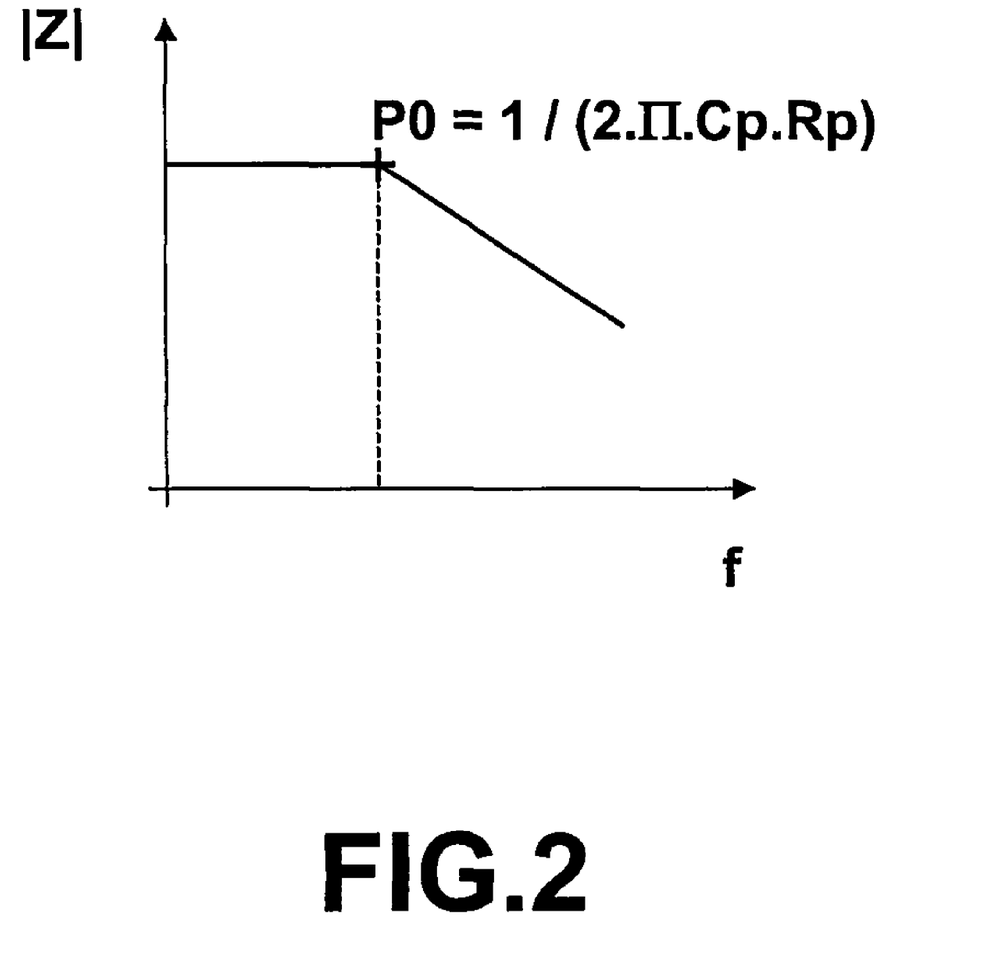
FIG. 2 depicts the change in the stray impedance of a switch as a function of frequency.

When the switching transistors TA–TB are switched, the Early effect which is manifested at the transistors must be taken into account for best modeling the dynamic characteristics of the switch. At low frequency, the Early effect is manifested in the form of a resistance Rp known as the Early resistance, with a high constant value between the collector and emitter of the transistors. At a higher frequency, stray capacitive effects of the switch function capacitances in the transistors TA–TB, interconnection capacitances between the elements constituting the switch equivalent to a capacitance Cp put in parallel to the current source I) manifest through an impedance with a value decreasing with the frequency. The Early effect combined with the stray capacitive effects are therefore equivalent to a stray impedance Z having the characteristics of a low-pass filter as depicted in FIG. 2. This stray impedance impairs the linearity of the digital to analog conversion.

Solutions are known for limiting the non-linearity of digital-to-analog converters using switched current sources and exhibiting an Early resistance. In particular, it is possible to insert, between each current source and the switching transistors, an additional stage of the cascode type so as to increase the impedance of the switch seen from its output.

These means for improving the linearity of digital-to-analog converters do however have limitations.

Indeed, this known solution involves associating as many additional circuits as there are switches. A power supply able to output a large current becomes necessary for supplying these additional circuits, which increases the size of the converter and makes it difficult to integrate it in an integrated circuit.

In addition, the stray effects of these many additional circuits interfere with the functioning of the converter overall.

Finally, adding these many additional circuits increases the cost of these digital-to-analog converters.

OBJECT AND SUMMARY OF THE INVENTION

The aim of the invention is to propose an economical solution for improving the non-linearity of digital-to-analog converters comprising switched current sources.

For this purpose, the invention is characterized in that the converter comprises means for generating a correction current added to said output current, said correction current comprising a component proportional to the square of said output current.

The generation means compensate for the leakage current in the stray impedance seen from the output of the converter, the stray impedance corresponding here to putting the Early resistances of each switch in parallel. For this purpose, a correction current with a magnitude equal to and in an opposite direction to the leakage current flowing in the stray impedance is re-injected at the output of the converter. The leakage current being proportional to the square of the number of switched current sources, the correction current is advantageously obtained from the square of the output potential of the converter. Thus the load resistance connected to the output of the converter has the total sum of the currents delivered by the switched current sources running through it. The effects related to the Early resistance are therefore cancelled out, which guarantees linearity of the digital-to-analog converter. In other words, the voltage at the terminals of the load resistance becomes proportional to the digital value to be converted. For a frequency twice the frequency of the digital signal, that is to say on the second harmonic, the gain in decibels of the digital-to-analog converter is greatly improved.

Contrary to the prior art, only one correction device is necessary for correcting the cumulative effect of the Early resistance of each switch. Such a solution therefore results in compactness, and is cost-effective.

The correction of the leakage current takes account of the number of switched current sources so that the linearity of the converter is improved over its entire conversion dynamic range.

The invention is also characterized in that the converter comprises a differential amplifier stage situated upstream of said generation means, said attenuator stage delivering to said generation means an output signal proportional to said analog quantity.

This stage allows to adjust the proportion of current to be re-injected at the output of the converter in order to compensate exactly for the leakage current flowing in the stray impedance. Its differential structure improves the common mode rejection rate.

The invention is also characterized in that the differential amplifying stage of the converter comprises a capacitive element for increasing the amplification factor as a function of the frequency.

This capacitive element disposed on the inputs of the differential amplifying stage allows to vary the frequency gain of this stage so as to compensate for the reduction in stray impedance as a function of frequency. A correction current with a higher amplifier will therefore be re-injected at the output of the converter for high frequencies. The linearity of the converter is therefore guaranteed, not only at low frequencies but also at high frequencies.

The invention is also characterized in that the converter comprises a Gilbert cell for generating said correction current.

This choice of implementation allows to generate a low correction current from a voltage signal of relatively high amplitude. The correction current generated at the output of the Gilbert cell therefore allows to precisely compensate for the leakage current at the output of the converter, which contributes fully to improving the linearity of the digital-to-analog converter.

The invention also relates to an integrated circuit comprising a digital-to-analog converter having the characteristics described above.

BRIEF DESCRIPTION OF THE DRAWINGS

The invention will be further described with reference to examples of embodiments shown in the drawings to which, however, the invention is not restricted.

DESCRIPTION OF PREFERRED EMBODIMENTS

FIG. 2 depicts the change in the modulus of the stray impedance Z of a switch for a current source as a function of frequency. This stray impedance Z is detrimental since it impairs the linearity of the digital to analog conversion since the current from the current sources is diverted in this impedance and does not entirely pass through the load resistance R.

In the diagram in FIG. 1, when the stray impedance is of the resistive type, it corresponds to putting in parallel the Early resistances of the K switched current sources.

It can be shown that:

$$Vout=(Z.VCC)/(R+Z)-R.Z/(R+Z)Iout \qquad Eq.1$$

where Iout is the sum of the currents switched by the K switched current sources according to the digital value K to be converted.

Each current source outputting a current I0, this therefore gives:

$$Iout=K.I0 \qquad Eq.2$$

The variations ΔVout of the voltage Vout as a function of the variations ΔIout of the current Iout, in absolute value and for given K, are written:

$$\Delta Vout=R.Z/(R+Z)\Delta Iout \qquad Eq.3$$

The non-linearity of the conversion stems from the term R.Z/(R+Z), whose value changes as a function of the value of the impedance Z, the value of this being a function of the value K to be converted. This is because, when several current sources are switched simultaneously, the impedance Z results from putting in parallel the K stray impedances Zu of the current sources. This therefore gives:

$$Z=Zu/K$$

Eq.3 is then written:

$$\Delta Vout=K.I0.R.[1/(1+\alpha.K)] \qquad Eq.4$$

where α=R/Zu (with R<<Zu)

The limited first-order development of [1/(1+α.K)] being equal to (1−α.K), Eq.4 becomes:

$$\Delta Vout \approx R.(I0.K-\alpha.I0.K^2) \qquad Eq.5$$

Eq.5 shows the presence of a term in $K^2$ which gives rise to the non-linearity of the conversion.

Figure 3:
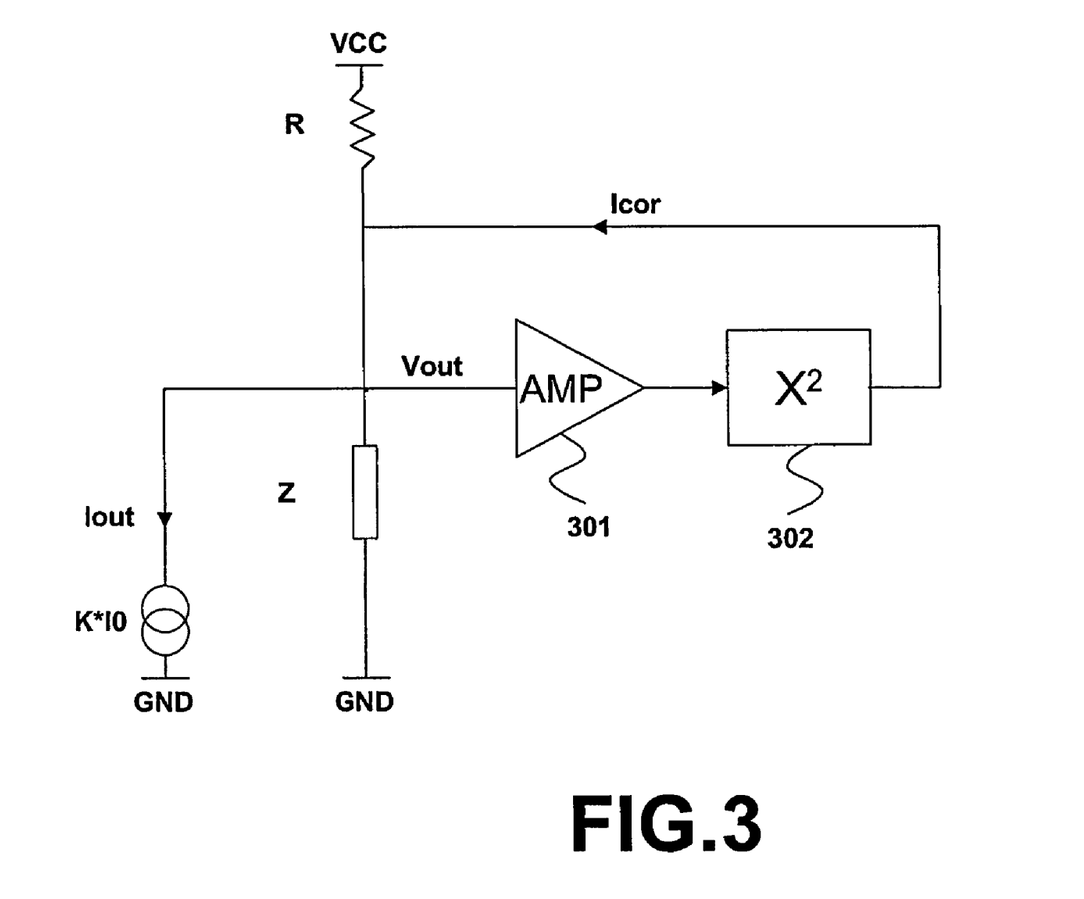
FIG. 3 depicts the outline diagram according to the invention for correcting the non-linearity of a digital-to-analog converter using switched current sources.

FIG. 3 depicts the outline diagram according to the invention for correcting the non-linearity of a digital-to-analog converter using switched current sources.

The principle of the invention is to re-inject at the output Vout of the digital-to-analog converter a correction current Icor=α.I0.$K^2$ in order to compensate for the leakage current in the stray impedance Z. This correction current Icor is generated by first of all taking a fraction of the variations in the potential Vout at the output of the digital analog converter through an amplification stage 301. Next, having regard to the fact that in Eq.5, (I0.K)>>(α.I0.$K^2$), squaring this signal fraction by an analog multiplier 302 generates an output quantity comprising principally a signal component proportional to $K^2$. The coefficient of constant value α.I0 is adjusted by adjusting the gain of the amplifying stage. The addition of the correction current Icor to the output current of the converter therefore compensates for the leakage current in the stray impedance Z. Thus the load resistance R has a current of value (I0.K) passing through it, which guarantees linearity of the digital to analog conversion.

When the analog output quantity $Vout_1$ decreases, more current sources are outputting in the output load. Thus the impedance Z results from putting in parallel a large number of Early resistances Zu, which makes the value of the impedance Z decrease. A current Icor of higher value is therefore necessary for compensating for the leakage current in the impedance Z.

Conversely, when the analog output quantity $Vout_1$ increases, fewer current sources are outputting in the output load. Thus the impedance Z results from putting in parallel a smaller number of Early resistances Zu, which makes the impedance value Z increase. A current Icor of lower value is therefore necessary for compensating for the leakage current in the impedance Z.

Figure 4:
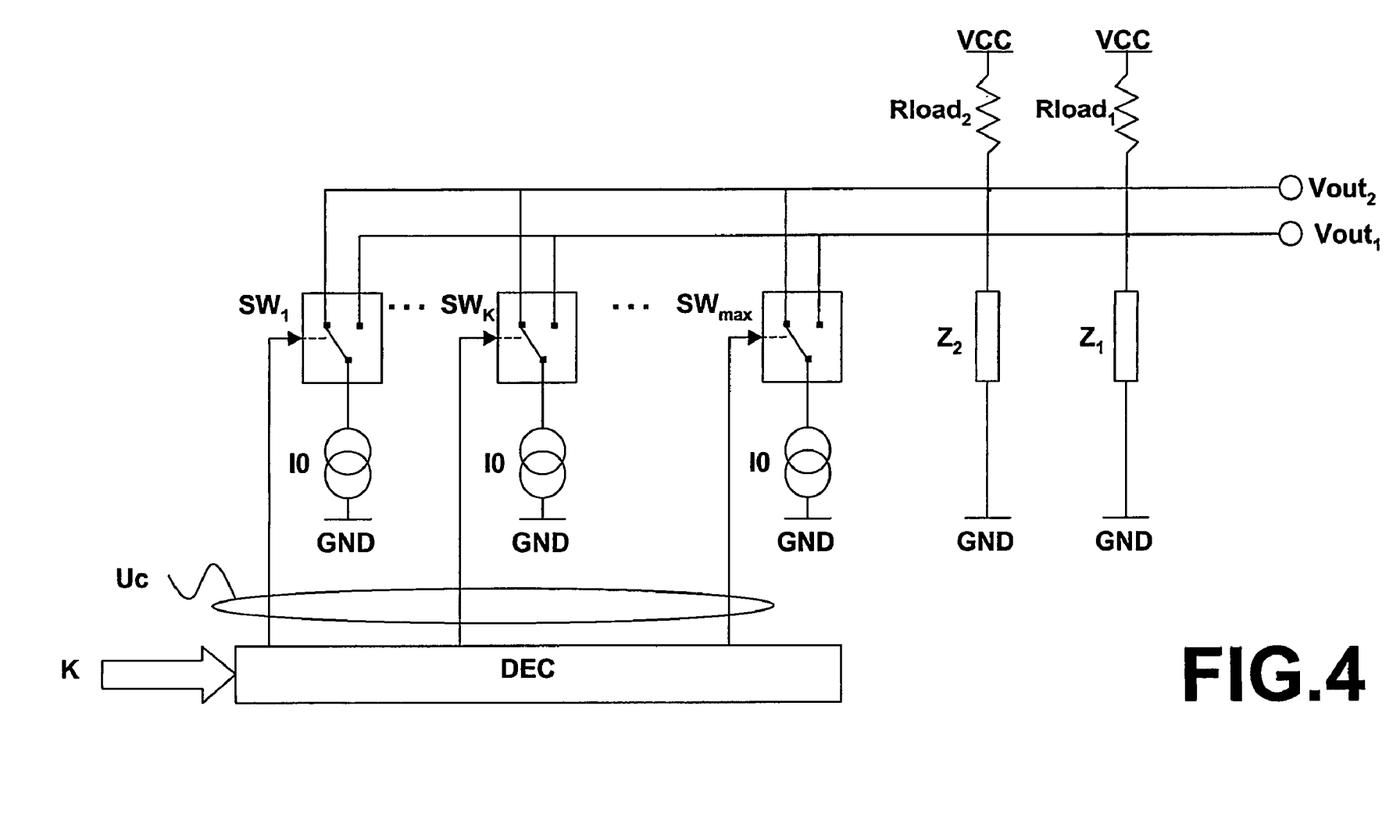
FIG. 4 depicts the diagram of a known digital-to-analog converter using switched current sources.

FIG. 4 depicts the diagram of a known digital-to-analog converter of the thermometric type using a number of switched current sources equal to $S_{max}$ for converting the binary input word K into an analog output quantity $Vout_1$ (and $Vout_2$).

This converter comprises a decoding module DEC for transforming the binary word K into an output signal Uc for controlling the closure of the current sources 10. In particular, a binary word of value K will be transformed into an output signal Uc having the first K bits at the high level, and the ($S_{max}$−K) other bits at the low level.

This converter comprises a number of switches $SW_i$ controlled by the output signal Uc equal to $S_{max}$. Each of these switches delivers a current of value I0 in an output load $R_{load1}$ (and $R_{load2}$). Having regard to the stray impedance $Z_1$ (or $Z_2$), the output quantity $V_{out1}$ is described by Eq.5.

It should be noted that the output $Vout_2$ is the complementary output of the output $Vout_1$ since, for a binary word K, the output load $Rload_2$ has a number of current sources equal to ($S_{max}$−K) passing through it, if the stray impedance $Z_2$ resulting from the switching of the $(S_{max}-K)$ current sources is not taken into account.

Figure 5:
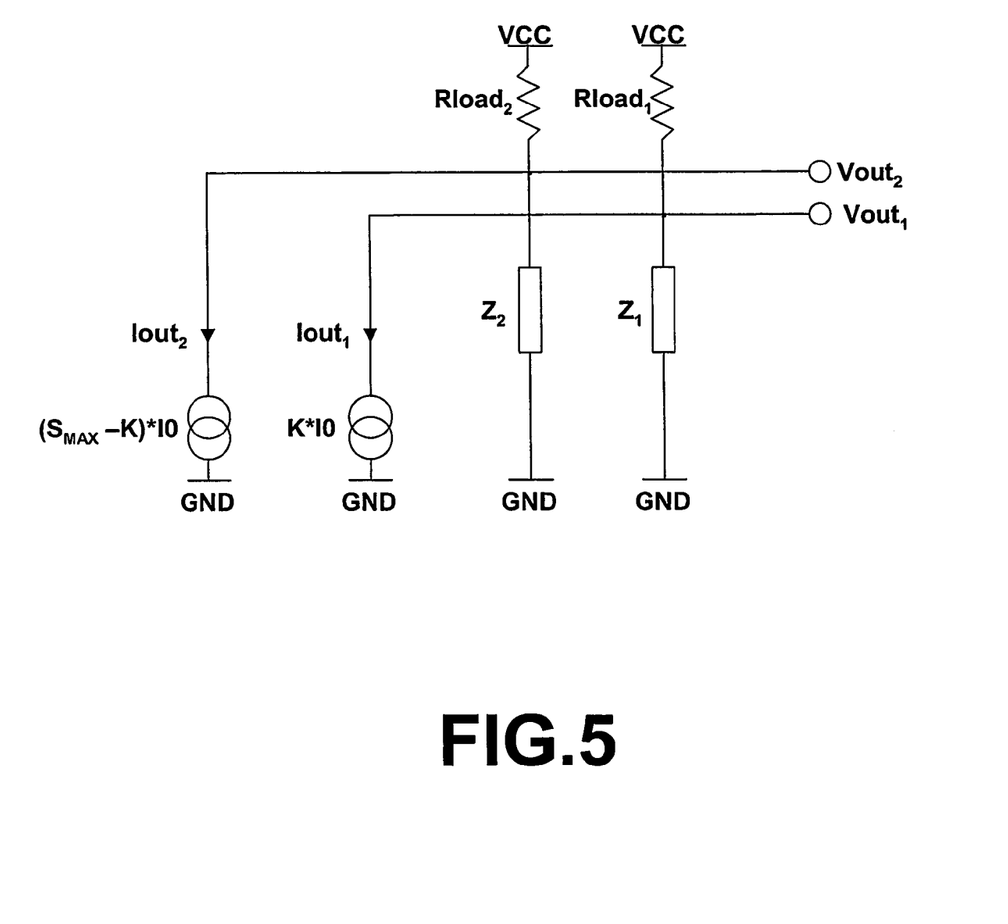
FIG. 5 depicts the equivalent diagram of a known digital-to-analog converter using switched current sources.

The equivalent diagram of this digital-to-analog converter is shown in FIG. 5.

Figure 6:
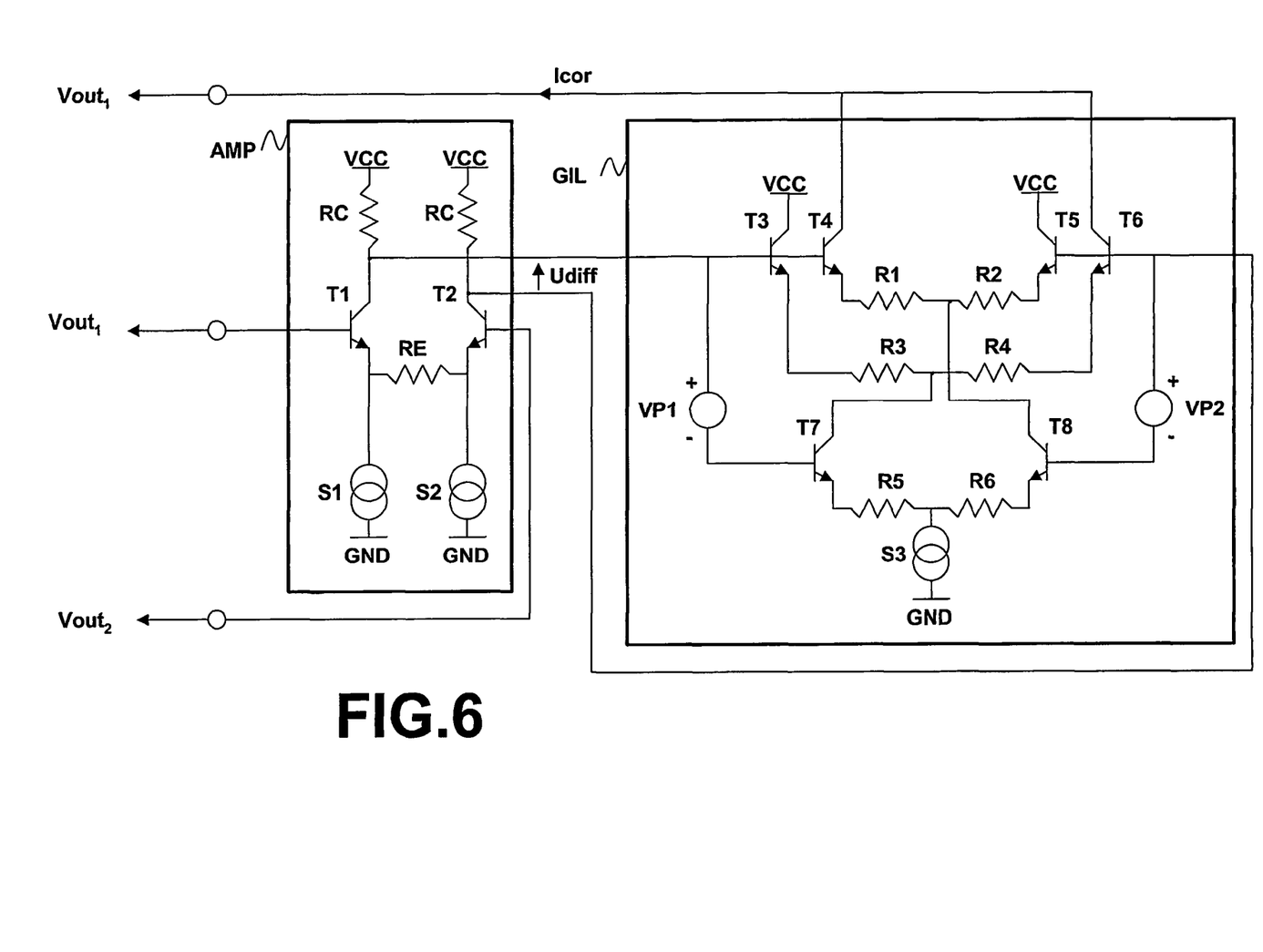
FIG. 6 depicts an embodiment according to the invention for correcting the non-linearity of a digital-to-analog converter using switched current sources.

FIG. 6 depicts an embodiment according to the invention for correcting the non-linearity of a digital-to-analog converter as presented in FIG. 4 and FIG. 5.

It comprises a differential amplifying stage AMP for taking a fraction Udiff of the output signal $Vout_1$. Advantageously, in order to improve the common mode rejection rate, this signal fraction is obtained by means of the amplifying stage AMP by taking off a fraction of the difference between the signal $Vout_1$ and the signal $Vout_2$. The amplifying stage corresponds to a differential pair comprising the transistors T1 and T2, the collector resistors RC, an emitter resistor RE, and two current sources S1 and S2. The transistors T1 and T2 receive respectively at their base the signals $Vout_1$ and $Vout_2$. The fraction Udiff of the signal taken off is adjusted according to the ratio RC/RE. The signal Udiff is available at the collectors of the transistors T1 and T2.

This embodiment also comprises a Gilbert cell, referenced GIL, based on a differential structure known per se to persons skilled in the art. This structure comprises the transistors T3-T4-T5-T6-T7-T8, the linearization resistors R1-R2-R3-R4-R5-R6, a biasing current source S3, and biasing voltage sources VP1–VP2 for biasing the transistors T7–T8 and effecting a downward shift of the input voltage Udiff. This Gilbert cell receives the signal Udiff in order to square the latter so as to deliver the correction current Icor.

The variations in the correction current Icor comprising a component principally proportional to $\Delta Vout^2$, having regard to Eq.5, the variations in the correction current Icor are also proportional to $K^2$. The correction current Icor is generated on the collector of the transistor T6, said collector being intended to be connected to the output $Vout_1$ of the digital-to-analog converter.

Thus the linearity of the output $Vout_1$ of the digital-to-analog converter is ensured.

Figure 7:
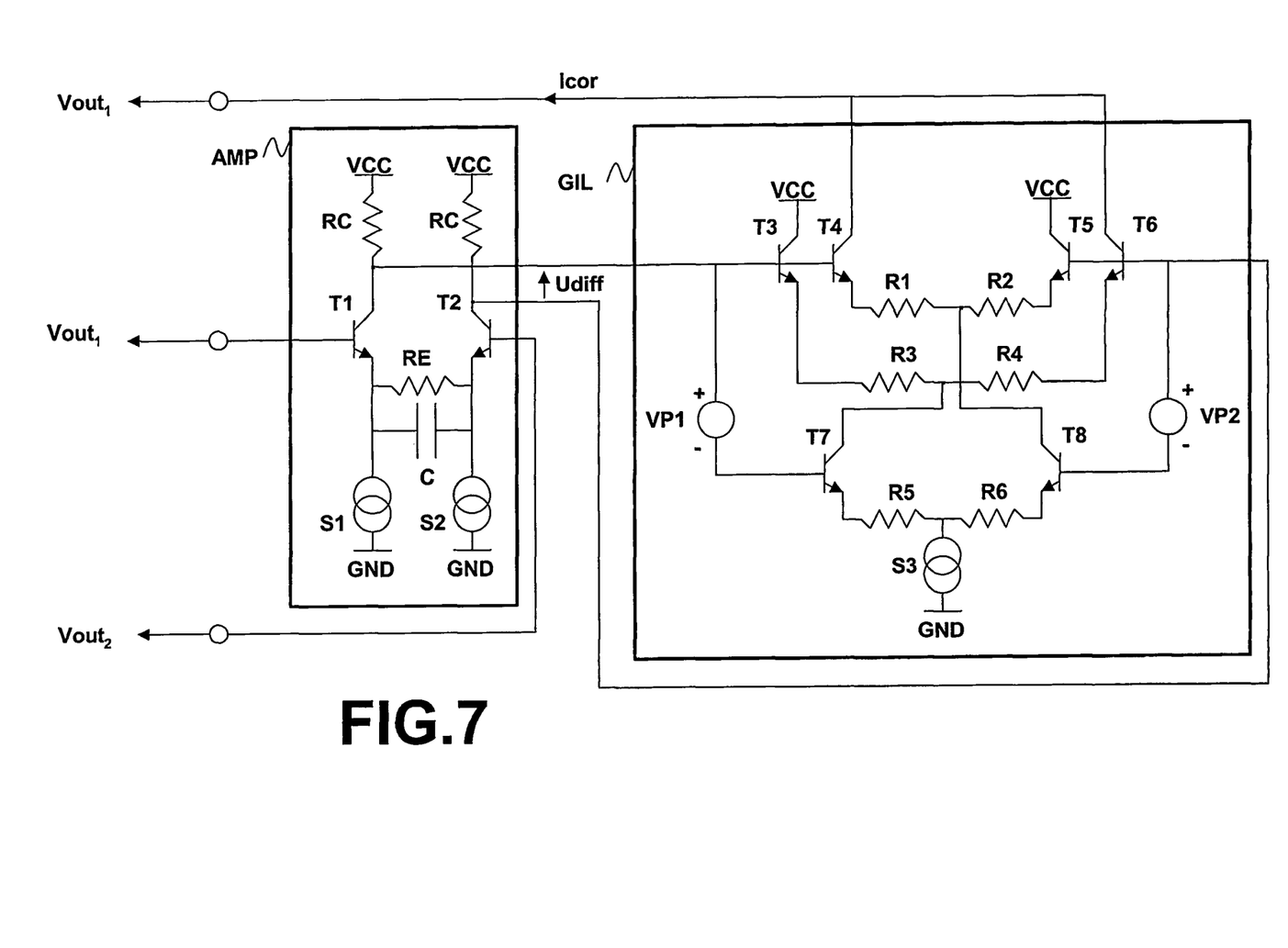
FIG. 7 depicts a particular embodiment according to the invention for correcting the non-linearity of a digital-to-analog converter using switched current sources.

FIG. 7 depicts a particular embodiment according to the invention for correcting the non-linearity of a digital-to-analog converter as presented in FIG. 4 and FIG. 5.

This converter repeats the characteristic of the embodiment described in FIG. 6 except that the differential amplifying stage comprises an additional capacitor C placed between the emitters of the transistors T1–T2.

This capacitor, disposed at the inputs of the differential stage, allows to vary the frequency gain of this stage so as to compensate for the reduction in the stray impedance when the frequency increases. This correction compensates for the effects related to the stray junction and interconnection capacitances between the elements constituting the switches.

For high frequencies, a correction current Icor of greater amplitude is therefore injected at the output of the converter.

The invention also concerns an integrated circuit comprising a digital-to-analog converter having the characteristics described above.

Such a converter can advantageously be used in a mobile telephony base station for converting into analog digital data to be transmitted, via a transmitter, to portable telephones. Such data to be transmitted can in particular be of the audio, video or image type.

Only the linearity correction of the output $Vout_1$ has been described. However, in a similar fashion and without departing from the scope of the invention, this same correction could be made to the complementary output $Vout_2$.

The invention has been described using a Gilbert cell for generating a square function of an input signal. However, the invention is not limited solely to this cell and other circuits for squaring a signal could be used without departing from the scope of the invention.

The invention claimed is:

1. A digital-to-analog converter for converting a digital value into an analog quantity, said converter comprising current sources switched as a function of said digital value in order to generate an output current reflecting the value of said analog quantity, said converter comprising means for generating a correction current added to said output current, said correction current comprising a component proportional to the square of said output current.

2. A converter as claimed in claim 1 further comprising a differential amplifying stage situated upstream of said generation means, said attenuating stage delivering to said generation means an output signal proportional to said analog quantity.

3. A converter as claimed in claim 2 wherein the differential amplifying stage comprises a capacitive element for increasing the amplification factor as a function of frequency.

4. A converter as claimed in one of claims 1 to 3 wherein the generation means comprise a Gilbert cell for generating said correction current.

5. An integrated circuit comprising a digital-to-analog converter for converting a digital value into an analog quantity, said converter comprising current sources switched as a function of said digital value in order to generate an output current reflecting the value of said analog quantity, the converter comprising means for generating a correction current added to said output current, said correction current comprising a component proportional to the square of said output current.

* * * * *